United States Patent [19]

Shibayama et al.

[11] 3,956,646

[45] May 11, 1976

[54] LITHIUM NIOBATE PIEZOELECTRIC SUBSTRATE FOR USE IN AN ELASTIC SURFACE WAVE DEVICE

[75] Inventors: Kimio Shibayama; Hiroaki Sato, both of Sendai, Japan

[73] Assignee: Nihon Dempa Kogyo Co., Ltd., Tokyo, Japan

[22] Filed: Dec. 30, 1974

[21] Appl. No.: 537,139

[30] Foreign Application Priority Data

Dec. 28, 1973 Japan .................................. 48-846

[52] U.S. Cl. .................................. 310/9.5; 310/9.8; 333/30 R

[51] Int. Cl.² .......................................... H01L 41/18

[58] Field of Search ............... 310/9.5, 9.6, 9.7, 9.8, 310/8.1; 333/30 R, 72

[56] References Cited

UNITED STATES PATENTS 3,680,009 7/1972 Slobodnik, Jr. .................. 310/9.5 X
3,714,476 1/1973 Epstein ................................ 310/9.5
3,725,827 4/1973 Slobodnik, Jr. .................. 310/9.5 X

OTHER PUBLICATIONS

Ultrasonics, Jan. 1971, pp. 35–48, article by J. deKlerk, entitled Ultrasonic Transducers, Surface Wave Transducers.

*Primary Examiner*—Mark O. Budd
*Attorney, Agent, or Firm*—Flynn & Frishauf

[57] ABSTRACT

A $\theta$-rotated Y-cut X-propagating piezoelectric substrate of crystalline lithium niobate for use in an elastic surface wave device, wherein the angle $\theta$ at which the substrate is cut out is chosen to range between 125.6° and 130.1° to suppress spurious wave components.

3 Claims, 5 Drawing Figures

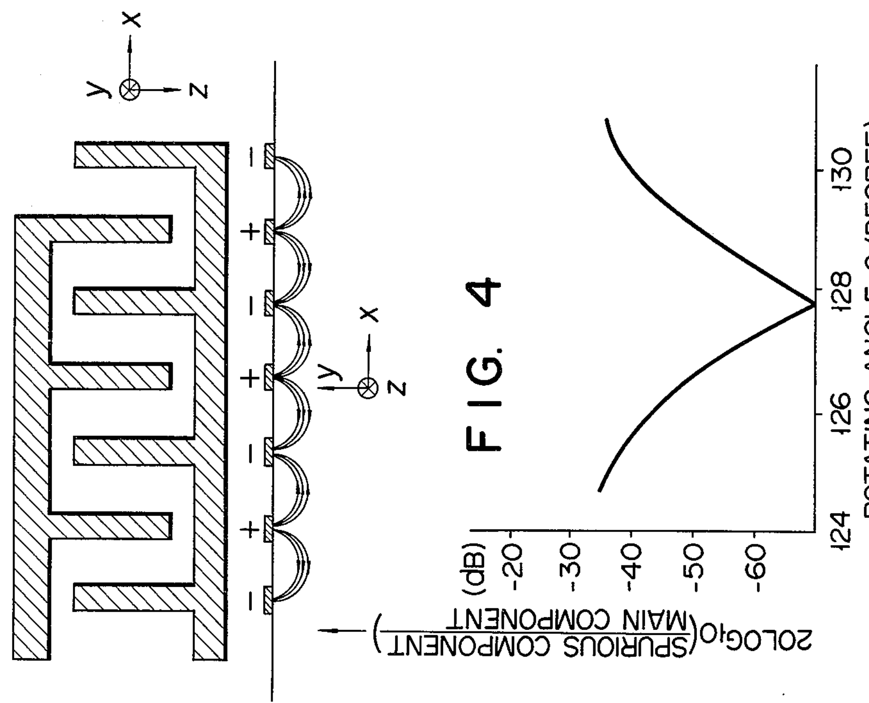
FIG. 3A
FIG. 3B
FIG. 4
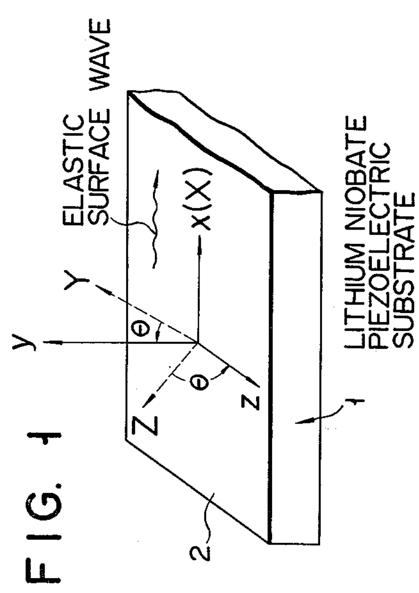
FIG. 1
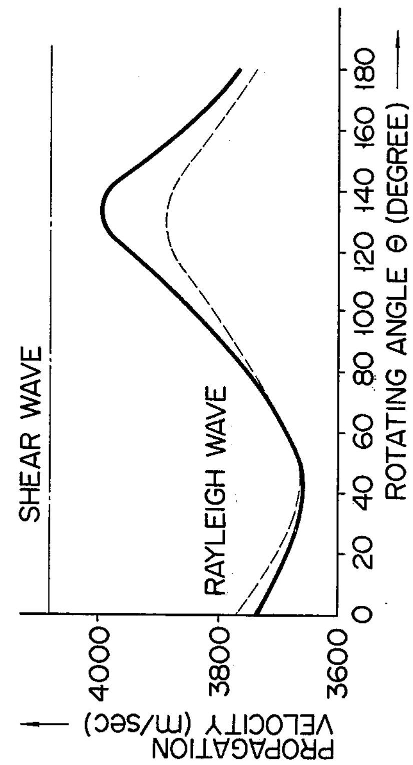
FIG. 2

LITHIUM NIOBATE PIEZOELECTRIC SUBSTRATE FOR USE IN AN ELASTIC SURFACE WAVE DEVICE

This invention relates to a piezoelectric substrate for use in an elastic surface wave device, and more particularly to a lithium niobate piezoelectric substrate.

With an elastic surface wave device used as a filter or delay line in the VHF and UHF bands, a single crystal lithium niobate offers a good prospect as an elastic surface wave piezoelectric substrate, because the crystal has a relatively large electromechanical coupling coefficient with respect to an elastic surface wave. Particularly, a rotated Y-cut plate has been preferably used, because the plate has a large electromechanical coupling coefficient for propagation of Rayleigh type elastic surface wave in the direction of the X-axis.

A 131° rotated Y-cut X-propagating lithium niobate ($LiNbO_3$) plate has the largest electromechanical coupling coefficient $k$ ($k^2=0.055$). With the rotated Y-cut plate, however, where the Rayleigh wave and the shear wave component of a bulk wave are propagated at velocities closely approximating each other, the shear wave acts as a spurious component most harmfully affecting the property of a filter or delay line. For instance, this spurious component prevents a filter from achieving sufficient guaranteed attenuation in the stop band and also reduces the signal to noise ratio in a delay line.

It is accordingly the object of this invention to provide a lithium niobate piezoelectric substrate for an elastic surface wave which prominently suppresses the generation of spurious wave components.

SUMMARY of the INVENTION

According to the present invention a lithium niobate acoustic surface wave substrate has an acoustic surface wave propagation surface parallel to the lithium niobate crystalline X-axis, the normal of the acoustic surface wave propagation surface intersecting the lithium niobate crystalline Y-axis at an angle $\theta$. The intersecting angle $\theta$ of the normal of the acoustic surface wave propagation surface and the lithium niobate crystalline Y axis ranges from 125.6° to 130.1°.

BRIEF DESCRIPTION OF THE DRAWINGS

FIG. 1 shows the angle at which a substrate is cut out of single crystal lithium niobate;

FIG. 2 is a curve diagram showing the cutting angle dependent property of the propagation velocity of the shear wave and Rayleigh wave on the rotated Y-cut substrate;

FIG. 3A illustrates interdigital electrodes generally used in a surface wave device;

FIG. 3B indicates the distribution of lines of electric force generated by the interdigital electrodes; and FIG. 4 is a characteristic curve showing the cutting of rotating angle dependent property of spurious component suppression with respect to a rotated Y-cut X-propagating lithium niobate crystalline plate for explanation of the invention.

DETAILED DESCRIPTION

Single crystal lithium niobate belongs to a trigonal system having a 3-fold rotation axis. With such crystal, the Z-axis is positioned parallel with the rotation axis, the Y-axis is set perpendicular to the Z-axis in a mirror plane, and the X-axis is disposed perpendicular to these Y and Z-axes, namely, the mirror plane. In this case, the piezoelectric constant matrix is expressed, according to the IRE standards, as follows:

$$\begin{pmatrix} 0 & 0 & 0 & 0 & e_{15} & -e_{22} \\ -e_{22} & e_{22} & 0 & e_{15} & 0 & 0 \\ e_{31} & e_{31} & e_{33} & 0 & 0 & 0 \end{pmatrix} \quad (1)$$

The above piezoelectric constant matrix acts as a guide to see the direction in which a stress is generated as well as its magnitude, when electric fields $E_X$, $E_Y$ and $E_Z$ are applied along the X, Y, Z-axes.

A lithium niobate crystalline plate 1 whose major surface 2 is cut, as shown in FIG. 1, perpendicularly to a new y-axis defined by the Y-axis counterclockwise rotated through angle $\theta$ ° about the X-axis (the Z-axis is also counterclockwise rotated through the angle of $\theta$° about the X-axis) is referred to as a $\theta$-rotated Y-cut X-propagating crystalline lithium niobate plate. The piezoelectric constant matrix of such rotated Y-cut plate is as follows:

$$\begin{pmatrix} 0 & 0 & 0 & 0 & e_{15}' & e_{16}' \\ e_{21}' & e_{22}' & e_{23}' & e_{24}' & 0 & 0 \\ e_{31}' & e_{32}' & e_{33}' & e_{34}' & 0 & 0 \end{pmatrix} \quad (2)$$

The velocity at which an elastic surface wave propagates in the X direction on a rotated Y-cut elastic surface wave substrate is known to have such a dependency on the cutting angle $\theta$ as shown in FIG. 2.

Referring to FIG. 2, the dotted and solid curves respectively represent the propagation velocities of the Rayleigh wave, where the major surface of the piezoelectric substrate is and is not coated with a conductive layer. Generally, a piezoelectric substrate where these propagating velocities are widely different from each other is preferred because of a large electromechanical coupling coefficient. FIG. 2 shows that where cut at an angle $\theta$ of about 131°, the piezoelectric substrate indicates a largest possible difference between the propagating velocities, and in consequence a maximum electromechanical coupling coefficient. Where, however, the cutting angle $\theta$ approaches 131°, then the propagation velocity of the Rayleigh wave is brought close to that of the shear wave as shown in FIG. 2. Therefore, the shear wave component is also transmitted and received as spurious component, raising the abovementioned problems. As apparent from FIG. 2, the shear wave is propagated at a velocity independent of the cutting angle $\theta$.

The transmitting and receiving electrodes of an elastic surface wave device generally consist of, as shown in FIG. 3A, interdigital electrodes of uniform overlap length formed on the major surface of a rotated Y-cut piezoelectric substrate. Lines of electric force passing across a pair of positive and negative electrode fingers of the interdigital electrodes are distributed in the semi-elliptical form as illustrated in FIG. 3B. Throughout the lines of electric force, an electric field component $E_X$ in the $x$ direction in which the elastic surface wave travels is mixed with an electric field component $E_Y$ in the y-direction perpendicular to the major surface of the rotated Y-cut piezoelectric substrate. In this case, an electric field component $E_z$ in the $z$ direction is not present. As seen from the formula (2), therefore, shear wave components or spurious components of shear wave are generated in accordance with the piezoelectric constants $e_{24}'$, $e_{15}'$ and $e_{16}'$ and the electric field components $E_X$, $E_Y$.

The inventors have experimentally seeked by using the interdigital electrodes of uniform overlap length shown in FIG. 3A the relationship between the rotation angle $\theta$ of the Y-axis on the $\theta$-rotated Y-cut X-propagating lithium niobate crystalline plate and a ratio of spurious components to the Rayleigh wave, proving that such a relationship as shown in FIG. 4 exists. Further, the inventors's experiments have shown that where the generation of spurious components is to be suppressed to a higher extent than 60dB, it is advised to set the cutting angle $\theta$ at a value lying between 127.2° and 128.5°, and where the generation is to be suppressed to a higher extent than 40dB, it is advised to set the cutting angle $\theta$ at a value ranging between 125.6° and 130.1°. It has also been found that where interdigital electrodes are formed on lithium niobate crystalline plate cut out at an angle $\theta$ of 127.86°, then it is possible to provide an elastic surface wave piezoelectric substrate capable of suppressing the generation of spurious components to a higher extend than 65dB.

FIG. 2 shows that where the lithium niobate piezoelectric substrate is cut at an angle $\theta$ ranging between 125.6° and 130.1°, then the substrate can have substantially the same electromechanical coupling coefficient as in the case of $\theta = 131°$, enabling an elastic surface wave to be sufficiently propagated in the X direction.

The piezoelectric substrate of crystalline lithium niobate according to this invention can effectively suppress the generation of spurious components even when ordinary interdigital electrodes of uniform overlap length formed on the major surface of the substrate are replaced by various weighting electrodes or coded electrodes.

What we claim is:

1. A lithium niobate acoustic surface wave substrate having an acoustic surface wave propagation surface parallel to the lithium niobate crystalline X-axis, the normal of said acoustic surface wave propagation surface intersecting the lithium niobate crystalline Y-axis at an angle $\theta$, the improvement wherein the intersecting angle $\theta$ of the normal of said acoustic surface wave propagation surface and the lithium niobate crystalline Y-axis ranges from 125.6° to 130.1°.

2. The lithium niobate acoustic surface wave substrate according to claim 1 wherein said intersecting angle $\theta$ ranges from 127.2° to 128.5°.

3. The lithium niobate acoustic surface wave substrate according to claim 2 wherein said intersecting angle $\theta$ is substantially 127.86°.

* * * * *